(12) United States Patent
Park et al.

(10) Patent No.: US 10,143,085 B2
(45) Date of Patent: Nov. 27, 2018

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/182,255

(22) Filed: Jun. 14, 2016

(65) Prior Publication Data
US 2017/0127520 A1    May 4, 2017

(30) Foreign Application Priority Data
Oct. 28, 2015  (KR) ................ 10-2015-0150377

(51) Int. Cl.
| H05K 1/18 | (2006.01) |
| H01G 4/005 | (2006.01) |
| H01G 4/12 | (2006.01) |
| H01G 4/232 | (2006.01) |
| H01G 4/248 | (2006.01) |

(Continued)

(52) U.S. Cl.
CPC .............. *H05K 1/181* (2013.01); *H01G 4/005* (2013.01); *H01G 4/12* (2013.01); *H01G 4/232* (2013.01); *H01G 4/248* (2013.01); *H01G 4/30* (2013.01); *H01G 4/38* (2013.01); *H05K 1/111* (2013.01); *H05K 2201/10015* (2013.01); *H05K 2201/1053* (2013.01); *H05K 2201/10636* (2013.01); *Y02P 70/611* (2015.11)

(58) Field of Classification Search
CPC ...................................................... H05K 1/181
USPC ......................................................... 174/260
See application file for complete search history.

(56) References Cited

U.S. PATENT DOCUMENTS

2001/0026444 A1* 10/2001 Matsushima .......... H05K 1/162
　　　　　　　　　　　　　　　　　　　　　　　361/763
2011/0043963 A1*  2/2011 Bultitude ................. H01G 2/16
　　　　　　　　　　　　　　　　　　　　　　　361/321.4

(Continued)

FOREIGN PATENT DOCUMENTS

| JP | 3847265 B2 | 11/1974 |
| JP | 10-275738 A | 10/1998 |

(Continued)

OTHER PUBLICATIONS

Korean Office Action issued in Korean Application No. 10-2015-0150377 dated Sep. 13, 2016, with English Translation.

*Primary Examiner* — Hoa C Nguyen
*Assistant Examiner* — Stanley Tso
(74) *Attorney, Agent, or Firm* — McDermott Will & Emery LLP

(57) ABSTRACT

A multilayer electronic component includes a first multilayer capacitor electrically connected to a first surface of a support plate formed of an insulating material; and first and second metal frames electrically connected to first and second ends of the support plate, respectively. The first and second metal frames extend in an amount greater than a thickness of the first multilayer capacitor so that a first end of the first and second metal frames constitutes a mounting part.

18 Claims, 8 Drawing Sheets

(51) Int. Cl.
*H01G 4/30* (2006.01)
*H01G 4/38* (2006.01)
*H05K 1/11* (2006.01)

(56) References Cited

U.S. PATENT DOCUMENTS

| | | | |
|---|---|---|---|
| 2011/0261503 A1* | 10/2011 | Aoyama | H01G 9/0029 361/524 |
| 2013/0146347 A1* | 6/2013 | McConnell | H01G 4/30 174/260 |
| 2015/0014038 A1 | 1/2015 | Park et al. | |
| 2015/0114697 A1* | 4/2015 | Murrell | H01G 4/232 174/255 |
| 2015/0206661 A1* | 7/2015 | Fujimura | H01G 4/30 361/301.4 |
| 2015/0296623 A1* | 10/2015 | Trinh | H01G 2/06 174/260 |

FOREIGN PATENT DOCUMENTS

| | | |
|---|---|---|
| JP | 2015-135910 A | 7/2015 |
| KR | 10-2001-0054575 A | 7/2001 |
| KR | 10-1018646 B1 | 3/2011 |
| KR | 0-2015-0006623 A | 1/2015 |

\* cited by examiner

MULTILAYER ELECTRONIC COMPONENT AND BOARD HAVING THE SAME

CROSS-REFERENCE TO RELATED APPLICATION

This application claims the benefit of priority to Korean Patent Application No. 10-2015-0150377, filed on Oct. 28, 2015 with the Korean Intellectual Property Office, the entirety of which is incorporated herein by reference.

BACKGROUND

The present disclosure relates to a multilayer electronic component and a board having the same.

A multilayer ceramic capacitor (MLCC), which is a type of multilayer electronic component, may be used in various electronic apparatuses owing to its various advantages, such as its small size, ability to secure high capacitance, and ease of mounting.

For example, an MLCC may be mounted in a circuit board of numerous electronic components including an image display device such as a liquid crystal display (LCD), a plasma display panel (PDP), a computer, a personal digital assistant (PDA), and a cellular phone to be used as a condenser acting to charge or discharge electricity.

Such an MLCC may have a structure having a plurality of dielectric layers and internal electrodes of different polarities, alternately disposed between the plurality of dielectric layers.

In this regard, since the dielectric layers may have a piezoelectric property, a piezoelectric phenomenon may occur between the internal electrodes when a direct or alternating current voltage is applied to the MLCC, which expands and contracts a volume of a ceramic body according to a frequency and generates periodic vibrations.

Such vibrations may be transferred to a circuit board through an external electrode of the MLCC and a solder connecting the external electrode and the circuit board, and thus an entire circuit board may act as an acoustic reflective surface, which may generate vibration sound experienced as noise.

The vibration sound may correspond to an audio frequency in a range from 20 to 20,000 Hz, which may cause human displeasure. Such a vibration sound causing human displeasure is known as acoustic noise.

The acoustic noise generated in the MLCC may be more noticeable due to the low noise level of a component of a modern electronic device, and thus research has been conducted into reducing the acoustic noise generated in the MLCC.

SUMMARY

An aspect of the present disclosure provides a multilayer electronic component capable of reducing an amount of piezoelectric vibrations transferred to a board from a multilayer ceramic capacitor (MLCC) and securing a high degree of reliability.

According to an aspect of the present disclosure, a multilayer electronic component comprises a first multilayer capacitor electrically connected to one surface of a support plate formed of an insulating material, and both ends of the support plate are electrically connected and coupled to first and second metal frames, respectively, the first and second metal frames extending lengthwise in an amount greater than a thickness of the first multilayer capacitor so that one end of the first and second metal frames constitutes amounting part.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
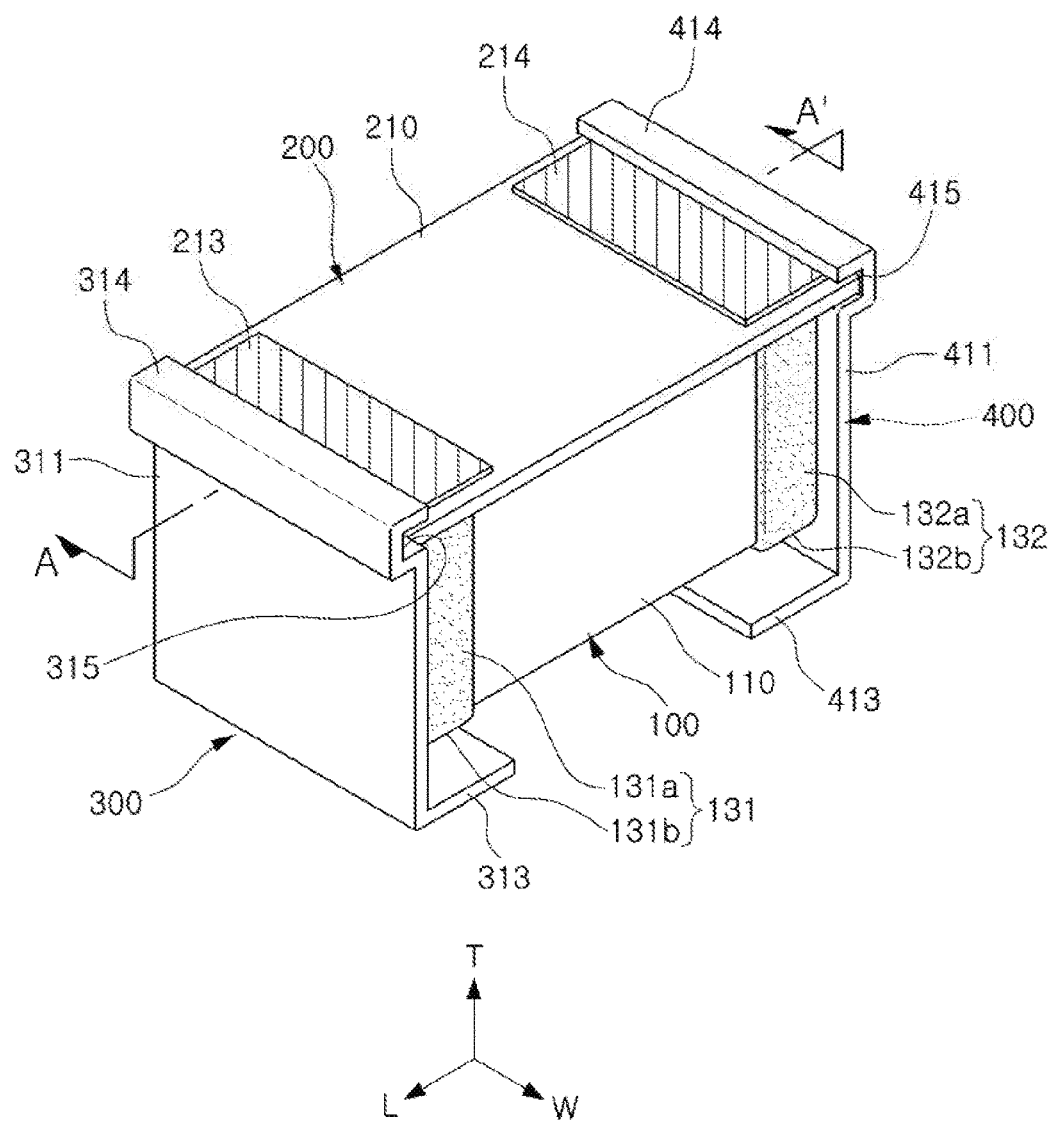
FIG. 1 is a perspective view schematically illustrating a multilayer electronic component according to an exemplary embodiment of the present disclosure.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

For clarity of description of the exemplary embodiments of the present disclosure, L, W, and T directions shown in FIG. 1 are respectively defined as a length direction, a width direction, and a thickness direction. In this regard, the thickness direction may be used as having the same meaning as that of a multilayer direction in which dielectric layers are stacked.

For convenience of description, in the present exemplary embodiment, lower and upper surfaces of a ceramic body opposing each other in the thickness direction are defined as first and second surfaces, respectively, surfaces thereof opposing each other in the length direction are defined as third and fourth surfaces, respectively, and surfaces thereof opposing each other in the width direction are defined as fifth and sixth surfaces, respectively. In this regard, the first surface is also defined as a mounting surface.

Multilayer Electronic Component

Figure 2:
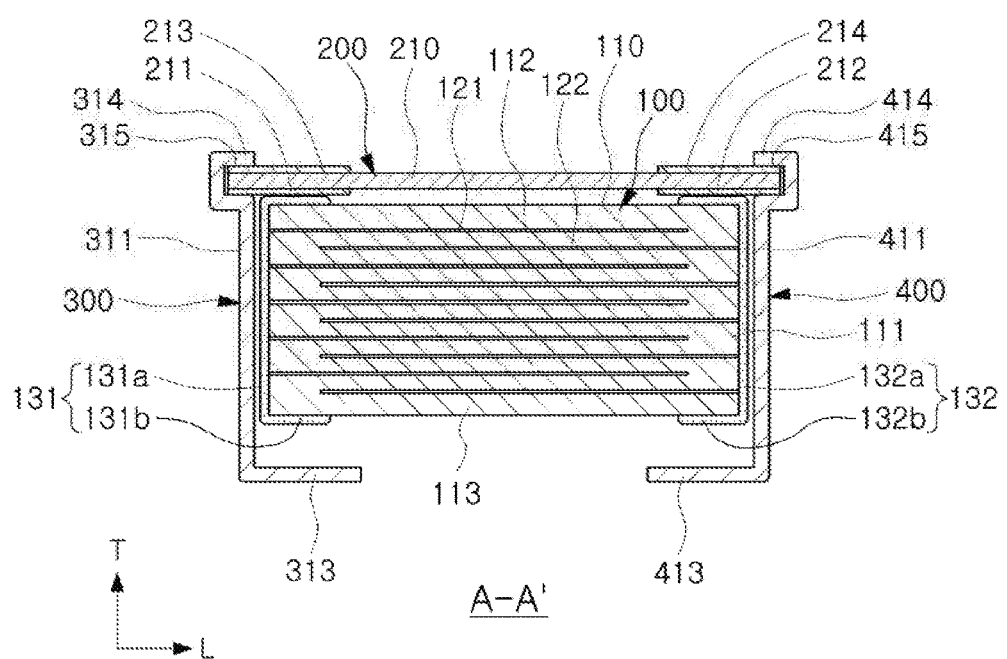
FIG. 2 is a cross-sectional view of line A-A' of FIG. 1.
Figure 3:
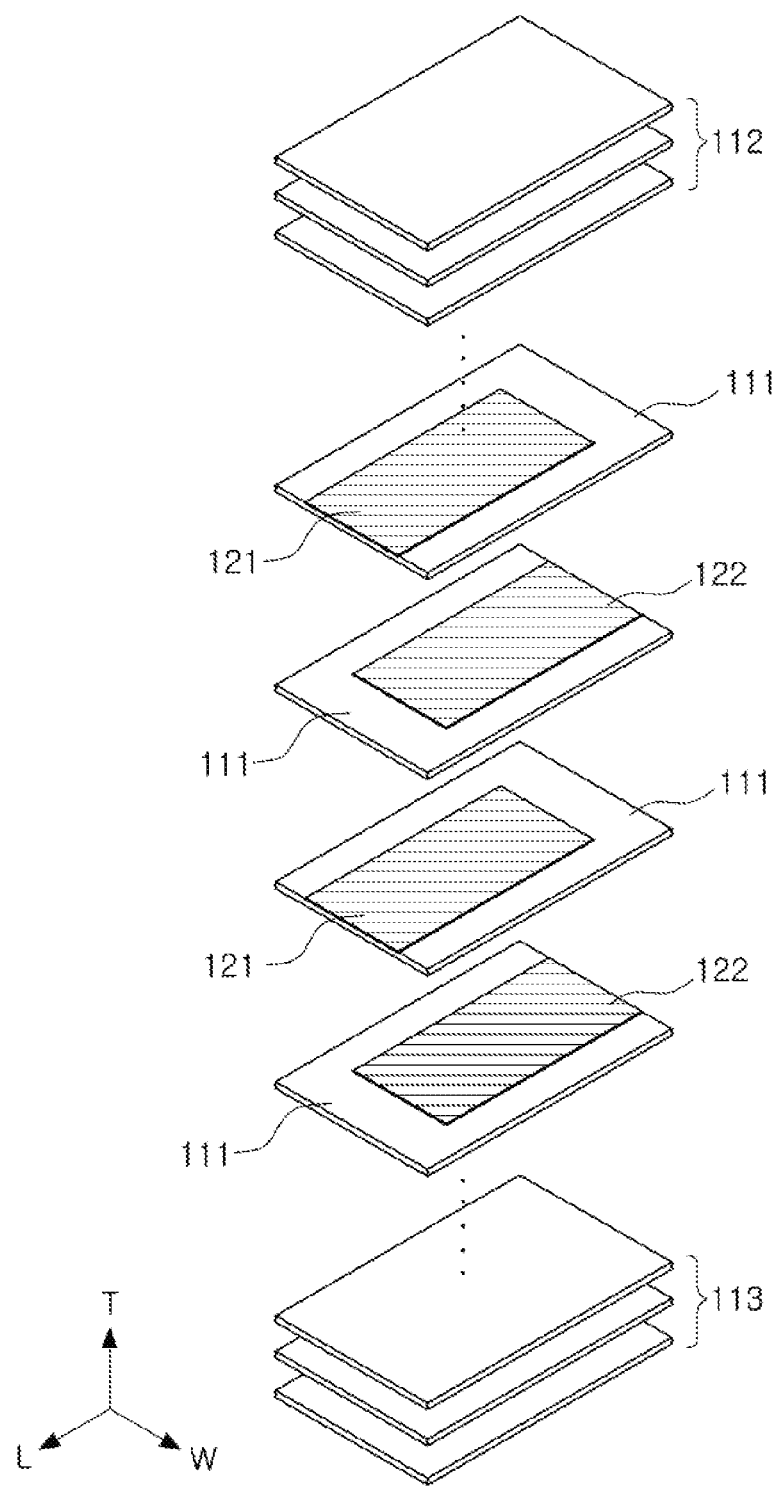
FIG. 3 is an exploded perspective view schematically illustrating a multilayer structure of internal electrodes of FIG. 1.

FIG. 1 is a perspective view schematically illustrating a multilayer electronic component according to an exemplary embodiment. FIG. 2 is a cross-sectional view of line A-A' of FIG. 1. FIG. 3 is an exploded perspective view schematically illustrating a multilayer structure of internal electrodes of FIG. 1.

Referring to FIGS. 1 through 3, the multilayer electronic component according to an exemplary embodiment may include a support plate 200, a first multilayer capacitor 100, and first and second metal frames 300 and 400.

The first multilayer capacitor 100 of the present embodiment may include a ceramic body 110, first and second internal electrodes 121 and 122, and first and second external electrodes 131 and 132.

The ceramic body 110 may be formed by stacking and then sintering a plurality of dielectric layers 111. In this regard, a shape and a size of the ceramic body 110 and the number of stacked dielectric layers 111 may be variously changed and are not limited to those shown in the present exemplary embodiment.

The plurality of dielectric layers 111 forming the ceramic body 110 may be in a sintered state so that adjacent dielectric layers 111 may be integrated to the extent that it may be difficult to distinguish boundaries therebetween without using a scanning electron microscope (SEM).

The ceramic body 110 may include an active layer as a portion contributing to capacitance formation of a capacitor and upper and lower cover layers 112 and 113 as upper and lower margin parts disposed in upper and lower portions of the active layer, respectively.

The active layer may be formed by repeatedly stacking the plurality of first and second internal electrodes 121 and 122 with the dielectric layers 111 disposed therebetween.

In this regard, thicknesses of the dielectric layers 111 may be arbitrarily changed in accordance with a capacitance design of the first multilayer capacitor 100.

The dielectric layers 111 may include ceramic powder having a high dielectric constant, for example, barium titanate ($BaTiO_3$) based powder or a strontium titanate ($SrTiO_3$) based powder, but the dielectric layers 111 is not limited thereto.

The upper and lower cover layers 112 and 113 may have the same material and configuration as the dielectric layers 111 of the active layer except that the upper and lower cover layers 112 and 113 do not include internal electrodes.

The upper and lower cover layers 112 and 113 may be formed by stacking a single dielectric layer or two or more dielectric layers in upper and lower portions of the active layer in the thickness direction, and may basically prevent the first and second internal electrodes 121 and 122 from being damaged due to a physical or chemical stress.

The first and second internal electrodes 121 and 122 may be electrodes having different polarities and may be formed by printing of a conductive paste including a conductive metal on the dielectric layers 111 at a predetermined thickness.

In this regard, the conductive metal included in the conductive paste may be, for example, nickel (Ni), copper (Cu), palladium (Pd) or alloys thereof, but the conductive metal is not limited thereto.

A method of printing the conductive paste may include, for example, a screen printing method or a gravure printing method, or the like, but the method of printing the conductive paste is not limited thereto.

The first and second internal electrodes 121 and 122 may be alternately stacked to face each other in a stacking direction of the dielectric layers 111 in the ceramic body 110.

The first and second internal electrodes 121 and 122 may be disposed to be alternately exposed through both end surfaces of the ceramic body 110 in a length direction with the dielectric layers 111 interposed therebetween.

In this regard, the first and second internal electrodes 121 and 122 may be electrically insulated from each other by the dielectric layers 111 interposed therebetween.

Portions of the first and second internal electrodes 121 and 122 alternately exposed through both end surfaces of the ceramic body 110 in the length direction may respectively be in mechanical contact with first and second connection parts of the first and second external electrodes 131 and 132 to be described later and may be electrically connected to the first and second external electrodes 131 and 132.

Therefore, if voltage is applied to the first and second external electrodes 131 and 132, charge may accumulate between the first and second internal electrodes 121 and 122 facing each other.

In this regard, capacitance of the first multilayer capacitor 100 may be in proportion to an area of regions of the first and second internal electrodes 121 and 122 that are overlapped with each other in the active layer.

Thicknesses of the first and second internal electrodes 121 and 122 may be determined according to use.

The first and second external electrodes 131 and 132 may be formed of a conductive paste including a conductive metal.

In this regard, the conductive metal may be, for example, nickel (Ni), copper (Cu), palladium (Pd), gold (Au) or alloys thereof but the conductive metal is not limited thereto.

The first and second external electrodes 131 and 132 may include first and second body parts 131a and 132a and first and second band parts 131b and 132b.

The first and second body parts 131a and 132a may be disposed on both surfaces of the ceramic body 110 in the length direction. The first and second band parts 131b and 132b may be formed to extend onto a portion of the first surface that is a mounting surface of the ceramic body 110 in the first and second body parts 131a and 132a.

In this regard, the first and second band parts 131b and 132b may be formed to further extend onto at least one surface among the second surface of the ceramic body 110, the third and fourth surfaces thereof in the length direction, and portions of fifth and sixth surfaces thereof in the width direction.

In the present exemplary embodiment, the first and second band parts 131b and 132b of the first and second external electrodes 131 and 132 are formed to extend onto the second surface of the ceramic body 110, the third and fourth surfaces thereof in the length direction, and the portions of fifth and sixth surfaces thereof in the width direction and cover both ends of the ceramic body 110 in the first and second body parts 131a and 132a but the first and second band parts 131b and 132b are not necessarily limited thereto.

The support plate 200 may be formed as a hexahedral body 210 extended in the length direction. The body 210 may be formed of an insulating material such as epoxy, phenol, polyimide resin, etc. but the body 210 is not limited thereto.

First and second conductive adhesion layers 211 and 212 may be disposed on a lower surface of the body 210 of the support plate 200 to be spaced apart from each other in the length direction. Third and fourth conductive adhesion layers 213 and 214 may be disposed on an upper surface of the body 210 to be spaced apart from each other in the length direction.

The first multilayer capacitor 100 may be electrically and connectably attached to the lower surface of the body 210 of the support plate 200. That is, the first and second band parts 131b and 132b of the first multilayer capacitor 100 may be in contact with the first and second conductive adhesion layers 211 and 212 of the body 210 of the support plate 200 so that the first and second band parts 131b and 132b may be electrically connected to the body 210 of the support plate 200.

In the first and second metal frames 300 and 400, first and second vertical parts 311 and 411 may be respectively disposed adjacently to the third and fourth surfaces of the first multilayer capacitor 100 attached to the body 210 in the length direction and may be electrically and connectably attached to both ends of the body 210.

Lower end portions of the first and second vertical parts 311 and 411 of the first and second metal frames 300 and 400 may be mounting portions mounted on a board by extending downward in a lengthwise direction in an amount greater than a thickness of the first multilayer capacitor 100.

First and second coupling grooves 315 and 415 may be formed in upper portions of the first and second vertical parts 311 and 411 of the first and second metal frames 300 and 400 so that both ends of the body 210 of the support plate 200 are respectively inserted into and coupled to the first and second coupling grooves 315 and 415. In this regard, the first and second conductive adhesion layers 211 and 212 disposed in the lower surface of the body 210 may be in contact with the first and second coupling grooves 315 and 415 and may be electrically connected to the first and second metal frames 300 and 400, respectively.

Lower end portions of the first and second metal frames 300 and 400 may be vertically curved toward the first multilayer capacitor 100 to configure first and second mounting parts 313 and 413 securing a contact area when mounted on the board.

The third and fourth conductive adhesion layers 213 and 214 may be disposed on the upper surface of the body 210 of the support plate 200 to be spaced apart from each other in the length direction.

The upper end portions of the first and second vertical parts 311 and 411 of the first and second metal frames 300 and 400 may be vertically curved in order to form the first and second coupling grooves 315 and 415. In this regard, curved first and second horizontal parts 314 and 414 may be tightly adhered to the upper surface of the body 210 of the support plate 200 and may be in contact with the third and fourth conductive adhesion layers 213 and 214.

As described above, if conductive adhesion layers are formed symmetrically in a vertical direction on upper and lower surfaces of the body 210, since vertical directionality is removed, a manufacturing method may be simplified.

Modified Example

Figure 4:
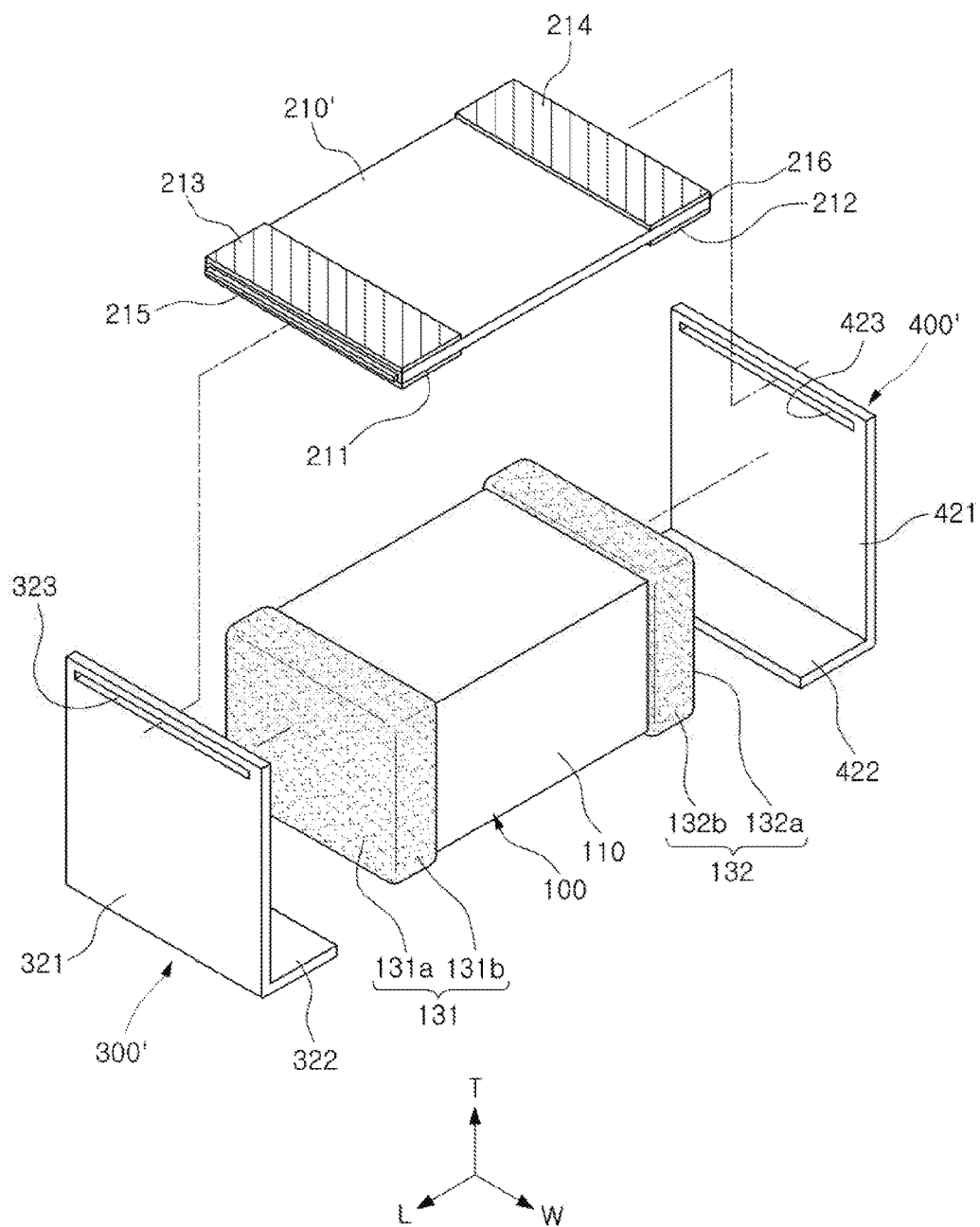
FIG. 4 is an exploded perspective view illustrating a multilayer electronic component according to another exemplary embodiment of the present disclosure.
Figure 5:
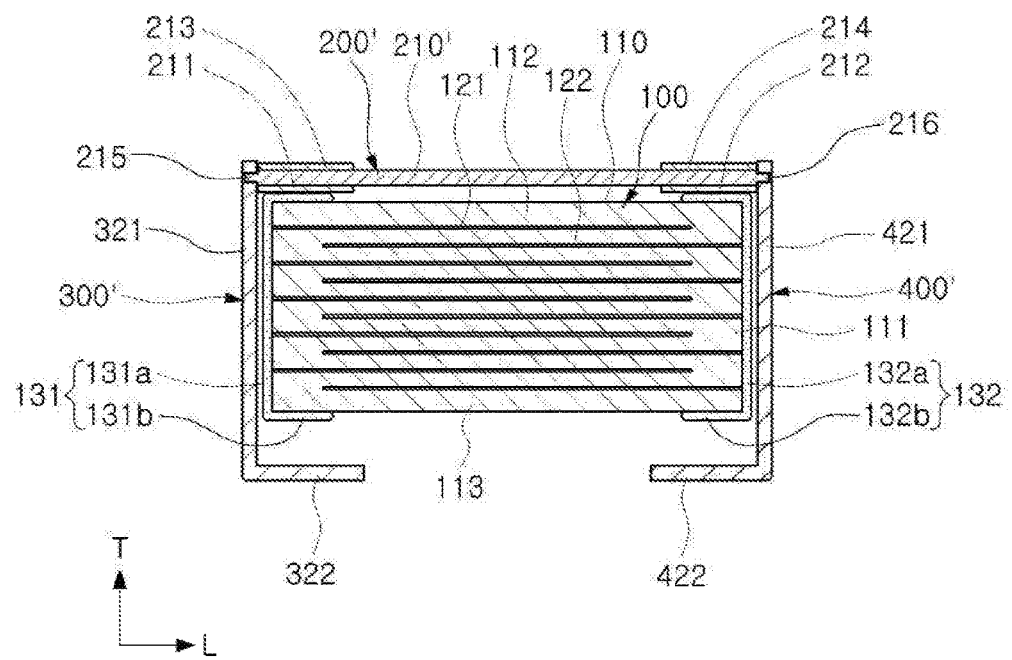
FIG. 5 is a cross-sectional view of a coupled state of FIG. 4.

FIG. 4 is an exploded perspective view illustrating a multilayer electronic component according to another exemplary embodiment. FIG. 5 is a cross-sectional view of a coupled state of FIG. 4.

Detailed descriptions of the same structure and operation as the exemplary embodiment described above are omitted here.

Referring to FIGS. 4 and 5, in the multilayer electronic component according to the present exemplary embodiment, first and second coupling protrusions 215 and 216 may be formed on both surfaces of a body 210' of a support plate 200' in the length direction, and first and second coupling holes 323 and 423 may be formed in upper portions of first and second metal frames 300' and 400', respectively, such that the first and second coupling protrusions 215 and 216 are respectively inserted into and coupled to the first and second coupling holes 323 and 423.

Figure 6:
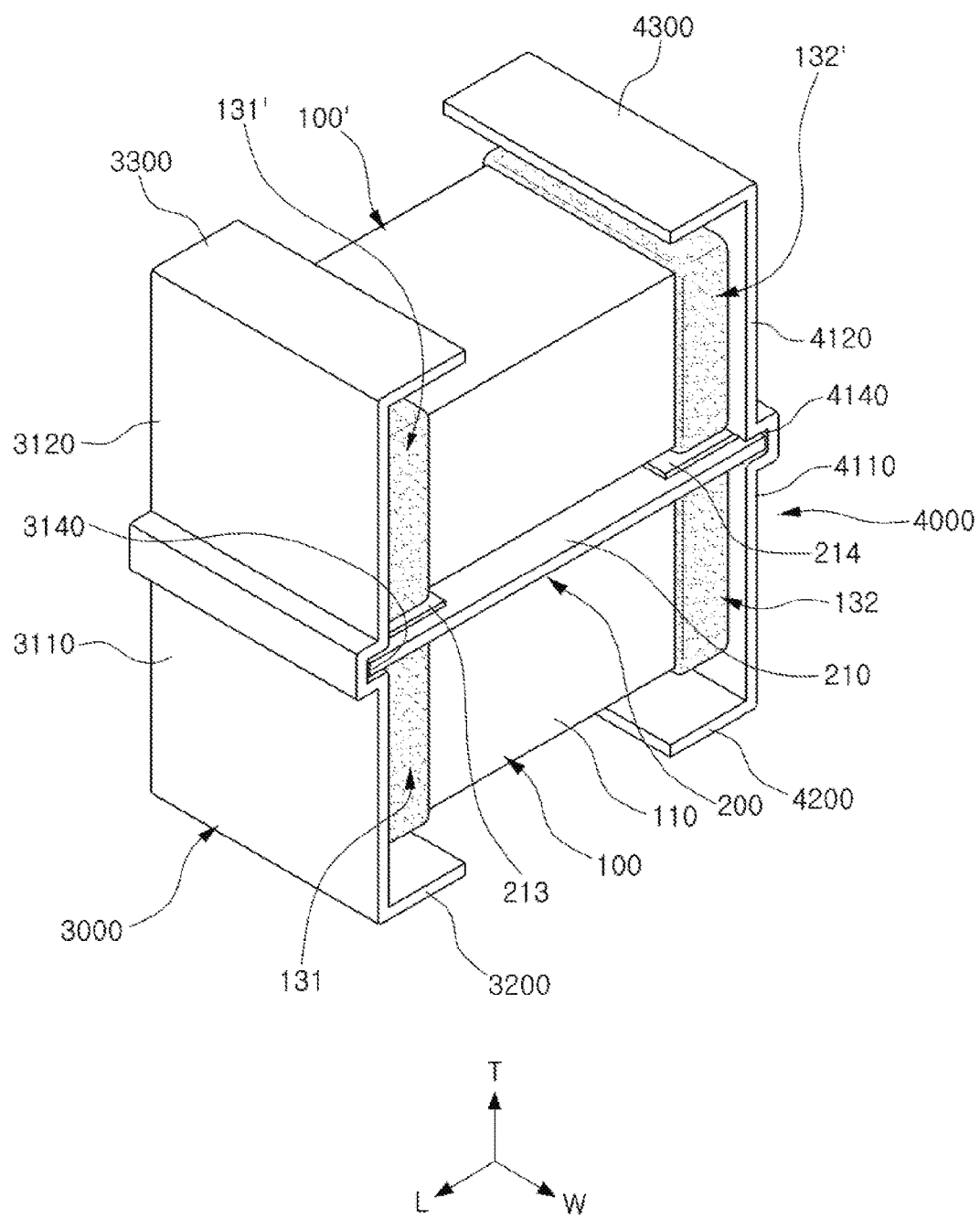
FIG. 6 is a perspective view schematically illustrating a multilayer electronic component according to another exemplary embodiment of the present disclosure.
Figure 7:
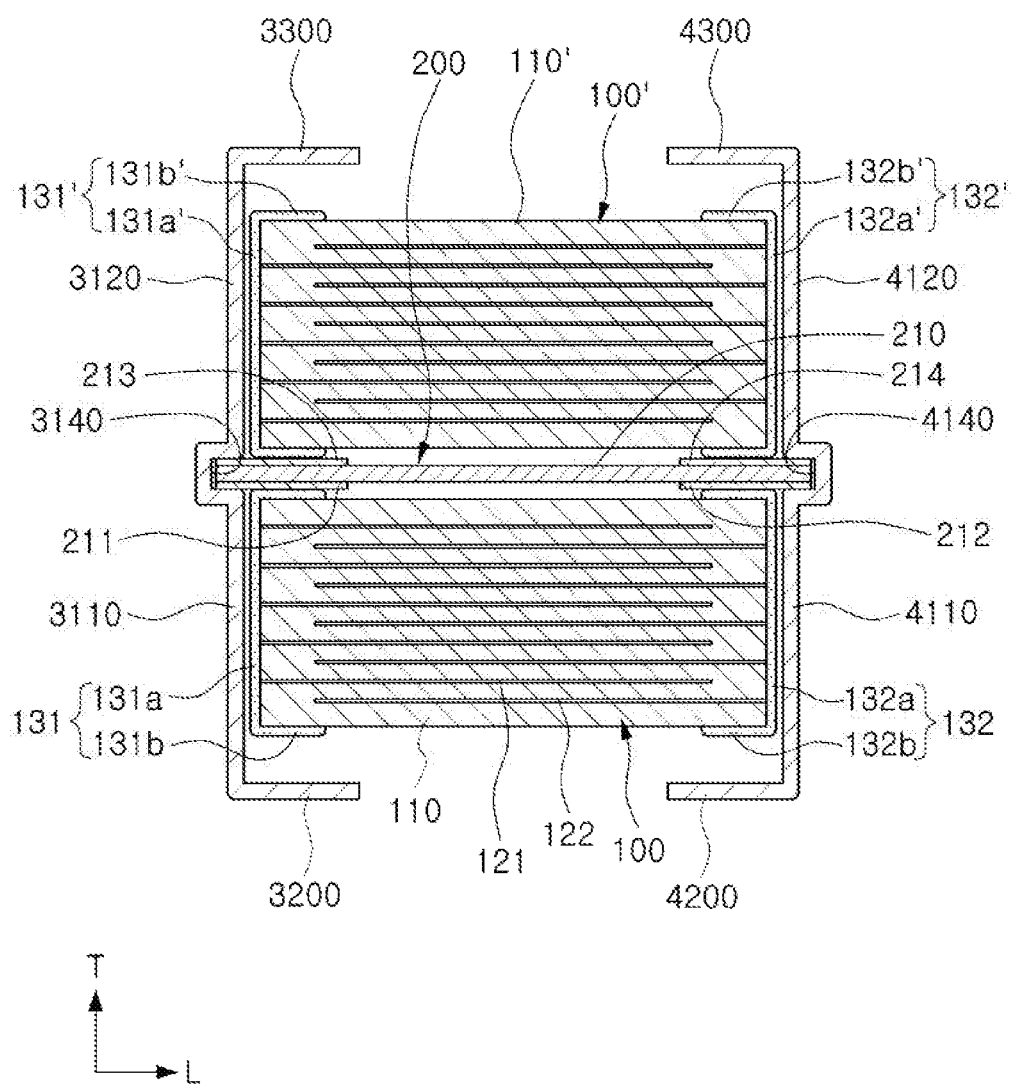
FIG. 7 is a cross-sectional view of FIG. 6.

FIG. 6 is a perspective view schematically illustrating a multilayer electronic component according to another exemplary embodiment. FIG. 7 is a cross-sectional view of FIG. 6.

Detailed descriptions of the same structure and operation as the exemplary embodiment described above are omitted here.

Referring to FIGS. 6 and 7, a second multilayer capacitor 100' may be disposed on an upper surface of the body 210 of the support plate 200.

Third and fourth external electrodes 131' and 132' may be formed on both ends of a ceramic body 110' of the second multilayer capacitor 100'.

The third and fourth external electrodes 131' and 132' may include third and fourth body parts 131a' and 132a' formed on both surfaces of the ceramic body 110' in the length direction and third and fourth band parts 131b' and 132b' extending from the third and fourth body parts 131a' and 132a' to portions of upper and lower surfaces of the ceramic body 110' and portions of both surfaces thereof in the width direction.

Therefore, the third and fourth band parts 131b' and 132b' of the second multilayer capacitor 100' may be electrically connected to the third and fourth conductive adhesion layers 213 and 214 of the body 210 of the support plate 200.

First and second metal frames 3000 and 4000 may respectively include first and second vertical parts having respective first and second coupling grooves 3140 and 4140. The first and second vertical parts may be divided into first and second upper vertical parts 3120 and 4120 and first and second lower vertical parts 3110 and 4110 in relation to the first and second coupling grooves 3140 and 4140.

The first coupling groove 3140 may be coupled to one end of the body 210 and may be connected to the first and third conductive adhesion layers 211 and 213 so that the first coupling groove 3140 may be electrically connected to the first and second multilayer capacitors 100 and 100'.

The second coupling groove 4140 may be coupled to another end of the body 210 and may be connected to the second and fourth conductive adhesion layers 212 and 214 so that the second coupling groove 4140 may be electrically connected to the first and second multilayer capacitors 100 and 100'.

The first and second lower vertical parts 3110 and 4110 of the first and second metal frames 3000 and 4000 may be vertically curved toward the first multilayer capacitor 100 to configure first and second mounting parts 3200 and 4200, respectively.

The first and second upper vertical parts 3120 and 4120 of the first and second metal frames 3000 and 4000 may be vertically curved toward the second multilayer capacitor 100' to configure third and fourth mounting parts 3300 and 4300, respectively.

As described above, if an electronic component is formed symmetrically in a vertical direction, since vertical directionality is removed, there is an effect of preventing a defect from occurring due to a changed vertical direction in advance when the electronic component is mounted on a board.

Capacitors may be mounted on upper and lower surfaces of the support plate 200 to face each other in the multilayer electronic component of the present exemplary embodiment, and thus the present exemplary embodiment provides a smaller component with improved capacitance.

Board on which a Multilayer Capacitor is Mounted

Figure 8:
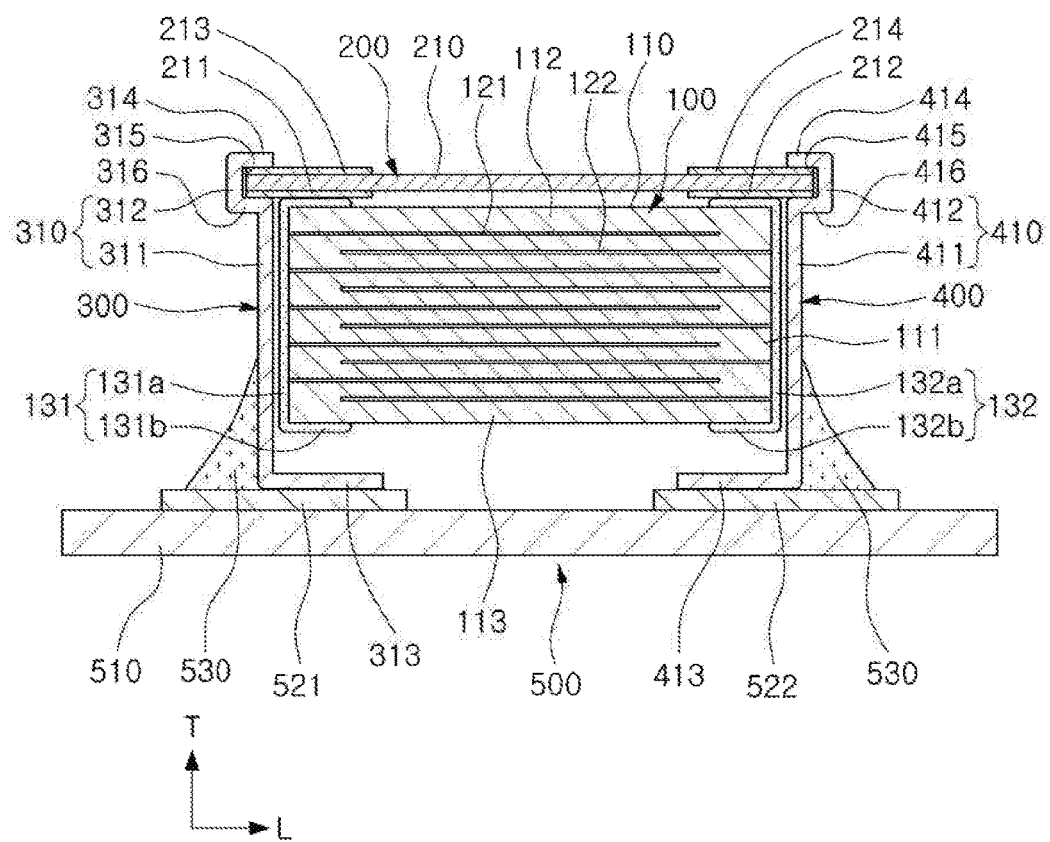
FIG. 8 is a cross-sectional view of a state in which the multilayer electronic component of FIG. 1 is mounted on a circuit board.

FIG. 8 is a cross-sectional view of a state in which the multilayer electronic component of FIG. 1 is mounted on a circuit board 510.

Referring to FIG. 8, a board 500 on which a multilayer capacitor according to the present exemplary embodiment is mounted may include the circuit board 510 and first and second electrode pads 521 and 522.

The ceramic body 110 of the first multilayer capacitor 100 may be mounted such that a lower surface of the ceramic body 110 faces an upper surface of the circuit board 510.

First and second electrode pads 521 and 522 may be formed to face each other on the upper surface of the circuit board 510 to be spaced apart from each other in the length direction.

That is, the first and second electrode pads 521 and 522 may be formed on the upper surface of the circuit board 510 in locations corresponding to the first and second mounting parts 313 and 413 of the first and second metal frames 300 and 400, respectively.

Therefore, the first multilayer capacitor 100 may be electrically connected to the circuit board 510 by a solder 530 in a state in which the first and second mounting parts 313 and 413 are located on the first and second electrode pads 521 and 522, respectively, to be in contact with the first and second electrode pads 521 and 522.

As set forth above, according to exemplary embodiments of the disclosure, because the solder is only formed on a surface perpendicular to a lower surface of a metal frame, an area of a solder forming portion may be reduced between the metal frame and a circuit board, which reduces the amount of stress or vibration according to piezoelectricity transferred to the circuit board through the solder, thereby reducing acoustic noise.

In addition, the elasticity of the metal frame may absorb a mechanical stress from the outside, thereby preventing the multilayer capacitor from being damaged, and the metal frame may absorb piezoelectric vibrations of the multilayer capacitor, thereby reducing vibrations transferred to the circuit board.

While exemplary embodiments have been shown and described above, it will be apparent to those skilled in the art that modifications and variations could be made without departing from the scope of the present disclosure as defined by the appended claims.

What is claimed is:

1. A multilayer electronic component comprising:
a first multilayer capacitor electrically connected to a first surface of a support plate formed of an insulating material; and
first and second metal frames electrically connected to first and second ends of the support plate, respectively;
wherein the first and second metal frames extend in an amount greater than a thickness of the first multilayer capacitor so that a first end of the first and second metal frames constitutes a mounting part,
wherein the mounting part is disposed on an opposite side of the first multilayer capacitor relative to the support plate,
wherein the first and second metal frames have first and second coupling grooves formed on upper portions of the first and second metal frames such that the first and second ends of the support plate are coupled to the first and second coupling grooves, respectively,
wherein the first multilayer capacitor is electrically connected to the first and second metal frames via the first and second ends of the support plate, respectively, and
wherein the first multilayer capacitor is spaced apart from the first and second metal frames.

2. The multilayer electronic component of claim 1, wherein the support plate has first and second coupling protrusions formed on both surfaces of the first and second ends of the support plate, and the first and second metal frames have first and second coupling holes formed on upper portions of the first and second metal frames such that the first and second coupling protrusions are coupled to the first and second coupling holes, respectively.

3. The multilayer electronic component of claim 1, wherein another end of the first and second metal frames extends to cover a portion of a second surface of the support plate.

4. The multilayer electronic component of claim 1, further comprising first and second conductive adhesion layers disposed on the first surface of the support plate to be spaced apart from each other in a length direction.

5. The multilayer electronic component of claim 4, further comprising third and fourth conductive adhesion layers disposed on a second surface of the support plate to be spaced apart from each other in the length direction.

6. The multilayer electronic component of claim 1, wherein the first end of the first and second metal frames is vertically curved toward the first multilayer capacitor.

7. The multilayer electronic component of claim 1, further comprising a second multilayer capacitor electrically connected to a second surface of the support plate.

8. The multilayer electronic component of claim 7, wherein a second end of the first and second metal frames extends more than a thickness of the second multilayer capacitor.

9. The multilayer electronic component of claim 7, wherein a second end of the first and second metal frames is vertically curved toward the second multilayer capacitor.

10. The multilayer electronic component of claim 1, wherein the support plate is formed of epoxy, phenol or polyimide resin.

11. A board on which a multilayer electronic component is mounted, the board comprising: a circuit board including an electrode pad disposed on an upper surface thereof,
wherein the first end of the first and second metal frames of the multilayer electronic component of claim 1 is mounted on the electrode pad.

12. A multilayer electronic component comprising:
a first multilayer capacitor electrically connected to a first surface of a support plate formed of an insulating material; and
first and second metal frames electrically connected to first and second ends of the support plate, respectively;
wherein the first and second metal frames extend in an amount greater than a thickness of the first multilayer capacitor so that a first end of the first and second metal frames constitutes a mounting part,
wherein the support plate is spaced apart from the mounting part by a distance greater than the thickness of the first multilayer capacitor,
wherein the first and second metal frames have first and second coupling grooves formed on upper portions of the first and second metal frames such that the first and second ends of the support plate are coupled to the first and second coupling grooves, respectively,
wherein the first multilayer capacitor is electrically connected to the first and second metal frames via the first and second ends of the support plate, respectively, and
wherein the first multilayer capacitor is spaced apart from the first and second metal frames.

13. The multilayer electronic component of claim 12, wherein the support plate has first and second coupling protrusions formed on both surfaces of the first and second ends of the support plate, and
the first and second metal frames have first and second coupling holes formed on upper portions of the first and second metal frames such that the first and second coupling protrusions are coupled to the first and second coupling holes, respectively.

14. The multilayer electronic component of claim 12, wherein another end of the first and second metal frames extends to cover a portion of a second surface of the support plate.

15. The multilayer electronic component of claim 12, further comprising first and second conductive adhesion layers disposed on the first surface of the support plate to be spaced apart from each other in a length direction.

16. The multilayer electronic component of claim 15, further comprising third and fourth conductive adhesion layers disposed on a second surface of the support plate to be spaced apart from each other in the length direction.

17. The multilayer electronic component of claim 12, wherein the first end of the first and second metal frames is vertically curved toward the first multilayer capacitor.

18. The multilayer electronic component of claim 12, further comprising a second multilayer capacitor electrically connected to a second surface of the support plate.

* * * * *